US010473524B2

(12) United States Patent
Koh et al.

(10) Patent No.: US 10,473,524 B2
(45) Date of Patent: Nov. 12, 2019

(54) OPTICAL FILTER AND OPTICAL SPECTROMETER INCLUDING THE SAME

(71) Applicant: SAMSUNG ELECTRONICS CO., LTD., Suwon-si (KR)

(72) Inventors: Weonkyu Koh, Suwon-si (KR); Junghyun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/685,280

(22) Filed: Aug. 24, 2017

(65) Prior Publication Data

US 2018/0216999 A1 Aug. 2, 2018

(30) Foreign Application Priority Data

Feb. 2, 2017 (KR) ........................ 10-2017-0015129

(51) Int. Cl.

*G01J 3/28* (2006.01)
*G01J 3/02* (2006.01)
*G02B 5/28* (2006.01)
*H01L 21/8258* (2006.01)
*H01L 21/02* (2006.01)

(Continued)

(52) U.S. Cl.

CPC ........... *G01J 3/2803* (2013.01); *G01J 3/0229* (2013.01); *G01J 3/42* (2013.01); *G02B 5/285* (2013.01); *H01L 21/02521* (2013.01); *H01L 21/8258* (2013.01); *G01J 2003/1213* (2013.01); *G01J 2003/1217* (2013.01); *G01J 2003/2806* (2013.01); *G01J 2003/2816* (2013.01)

(58) Field of Classification Search

CPC .................................................... G01J 3/2803
USPC .......................................................... 356/416
See application file for complete search history.

(56) References Cited

U.S. PATENT DOCUMENTS 3,984,721 A * 10/1976 Sato ........................ H01J 29/38 313/371
6,133,063 A * 10/2000 Speier ..................... C04B 41/89 257/290

(Continued)

FOREIGN PATENT DOCUMENTS

CN 105609588 A 5/2016
CN 105762283 A 7/2016

(Continued)

OTHER PUBLICATIONS

Jie Bao, et al; "A colloidal quantum dot spectrometer"; Nature; Jul. 2, 2015; vol. 523; 16 pgs. total.

(Continued)

*Primary Examiner* — Kara E. Geisel
*Assistant Examiner* — Omar H Nixon
(74) *Attorney, Agent, or Firm* — Sughrue Mion, PLLC

(57) ABSTRACT

An optical spectrometer may include an optical filter including a plurality of filter layers formed on a base substrate. The filter layers may include a perovskite material and at least two filter layers among the plurality of filter layers may include perovskite materials having different composition ratios from each other. The filter layers may show respective band-gap characteristics in different optical wavelength ranges from each other, in an optical absorption spectrum and/or an optical transmission spectrum.

12 Claims, 5 Drawing Sheets

L1
20
22a 22b
21
L2

(51) Int. Cl.
*G01J 3/42* (2006.01)
*G01J 3/12* (2006.01)

(56) References Cited

U.S. PATENT DOCUMENTS

| | | | | |
|---|---|---|---|---|
| 6,486,950 | B1 * | 11/2002 | Munks | G01J 3/2803 250/226 |
| 6,538,359 | B1 * | 3/2003 | Hiraku | H03H 9/02574 310/313 R |
| 2002/0153549 | A1 * | 10/2002 | Laibowitz | H01L 21/265 257/298 |
| 2002/0154315 | A1 * | 10/2002 | Myrick | G01J 3/18 356/305 |
| 2002/0163641 | A1 * | 11/2002 | Shroder | G01J 3/02 356/419 |
| 2003/0148881 | A1 * | 8/2003 | Matsuo | B01J 21/063 502/304 |
| 2006/0176485 | A1 * | 8/2006 | Bulovic | G01J 3/02 356/419 |
| 2012/0147523 | A1 * | 6/2012 | Park | B82Y 30/00 361/321.4 |
| 2012/0298957 | A1 * | 11/2012 | Iguchi | H01L 27/1464 257/21 |
| 2012/0305918 | A1 * | 12/2012 | Shum | H01L 21/02381 257/49 |
| 2014/0061486 | A1 | 3/2014 | Bao et al. | |
| 2014/0211492 | A1 * | 7/2014 | Neuman | G02B 1/10 362/494 |
| 2016/0056337 | A1 * | 2/2016 | Chao | H01L 33/26 257/103 |
| 2016/0133672 | A1 * | 5/2016 | Koposov | H01L 27/302 136/255 |
| 2016/0252652 | A1 * | 9/2016 | Shen | G02B 1/005 359/485.02 |
| 2016/0276612 | A1 * | 9/2016 | Gotanda | H01L 51/445 |
| 2016/0293333 | A1 * | 10/2016 | Kaneko | H01G 4/232 |
| 2016/0343965 | A1 * | 11/2016 | Marks | H01L 51/4213 |
| 2017/0018372 | A1 * | 1/2017 | Fujimura | H01L 51/4226 |
| 2017/0222162 | A1 * | 8/2017 | Lee | H01L 51/0077 |
| 2017/0241836 | A1 * | 8/2017 | Langner | G01J 3/26 |

FOREIGN PATENT DOCUMENTS

| | | | |
|---|---|---|---|
| JP | 2012-225961 | A | 11/2012 |
| KR | 10-2014-0140038 | A | 12/2014 |

OTHER PUBLICATIONS

Georgian Nedelcu et al; Fast Anion-Exchange in Highly Luminescent Nanocrystals of Cesium Lead Halide Perovskites (CsPbX3, X=Cl, Br, I); Nano Letters; 2015; vol. 15; pp. 5635-5640; 6 pgs. total.

* cited by examiner

OPTICAL FILTER AND OPTICAL SPECTROMETER INCLUDING THE SAME

CROSS-REFERENCE TO RELATED APPLICATION

This application claims priority from Korean Patent Application No. 10-2017-0015129, filed on Feb. 2, 2017, in the Korean Intellectual Property Office, the disclosure of which is incorporated herein in its entirety by reference.

BACKGROUND

1. Field

One or more exemplary embodiments relate to an optical device, and more particularly, to an optical filter and an optical spectrometer including the same.

2. Description of the Related Art

An optical spectrometer is an important device in sensors applied to various areas such as non-invasive medical sensing and internet of things (IoT) networks. There is an increasing demand for miniaturization of optical spectrometers for various applications of the optical spectrometers.

A filter configuration of a prism or a grating structure is generally used to provide an optical spectrometer. Various studies have been conducted to overcome limitations of optical angle-sensitivity and optical sensibility in order to realize the miniaturization of the optical spectrometer. Recently, a filter-type optical spectrometer using quantum dots has been studied. A method using quantum dots is to realize spectroscopy by changing the optical sensitivity per wavelength of light to quantum dots of various sizes.

SUMMARY

One or more exemplary embodiments provide an absorption filter including a filter layer formed of perovskite material.

One or more exemplary embodiments provide a miniaturized optical spectrometer including an optical filter including filter layers having different composition ratios of a perovskite material from each other.

Additional aspects will be set forth in part in the description which follows and, in part, will be apparent from the description, or may be learned by practice of the exemplary embodiments.

According to an aspect of an exemplary embodiment, an optical filter may include: a base substrate including a transparent material; and a filter layer on the base substrate, wherein the filter layer includes a perovskite material.

The filter layer may include a plurality of filter layers and at least two filter layers formed of perovskite materials having different composition ratios from each other.

The at least two filter layers may have different optical absorption rates or different optical transmittances from each other.

The at least two filter layers may have band-gap characteristics in different optical wavelength ranges from each other in an optical absorption spectrum or an optical transmission spectrum.

The perovskite material may be represented as a chemical formula of $ABX_3$, wherein A denotes ammonium salt or cesium (Cs), B denotes tin (Sn) or lead (Pb), and X denotes a halogen element. The halogen element may be chloride (Cl), bromide (Br), or indium (I).

The perovskite material may be $CsPbBr_{3-x}Cl_x$ ($0 \le x \le 3$) or $CsPbBr_{3-x}I_x$ ($0 \le x \le 3$), and the at least two filter layers may include the perovskite materials having different values of x from each other.

Widths of the at least two filter layers may be in a range of about 1 μm to several millimeters.

According to an aspect of another exemplary embodiment, an optical spectrometer may include: a light source; an optical filter on which a first optical signal irradiated from the light source is incident, directly or via an object; and a photodetector on which a second optical signal passing through the optical filter is incident, wherein the optical filter includes a filter layer and the filter layer includes a perovskite material.

The optical filter may include a transparent base substrate; and a filter layer on the base substrate, and the base substrate may be on the photodetector to form the optical filter and the photodetector in an integrated body.

According to an aspect of another exemplary embodiment, an optical spectrometer may include a light source; and an integrated body of an optical filter and a photodetector on which a first optical signal irradiated from the light source is incident, either directly or via an object, wherein the integrated body of the optical filter and the photodetector includes a p-n junction structure including an n-type layer formed on a bottom structure and a p-type layer formed on the n-type layer.

The p-type layer may include a perovskite material and the n-type layer may include metal oxides having the n-type characteristics such as zinc (Zn) oxides or titanium (Ti) oxides.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
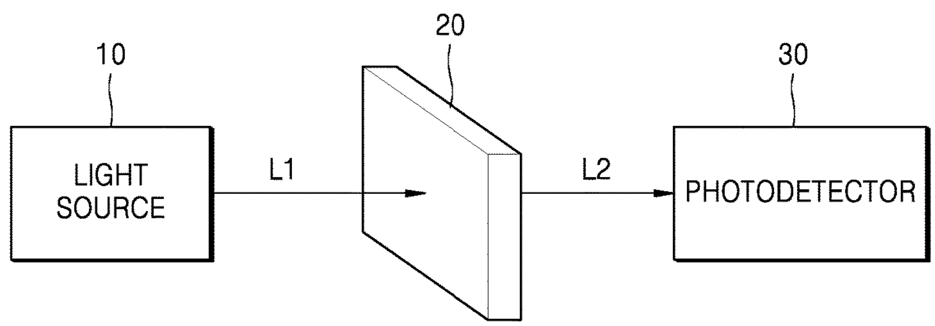
FIG. 1 is a diagram illustrating an optical spectrometer including an optical filter, according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain various aspects. Expressions such as "at least one of," when preceding a list of elements, modify the entire list of elements and do not modify the individual elements of the list.

A detailed description is provided below with reference to the appended drawings showing a radiation detector and a radiographic apparatus including the same. Like reference numerals refer to like elements throughout the drawings. Sizes of elements in the drawings may be exaggerated for clarity and convenience of explanation.

In the case where a position relationship between two items is described with the terms "on ~" or "on the top of ~", one item may be not only directly on the other item while being in contact with the other item but may also be on the other item without being in contact with the other item.

An expression used in the singular encompasses the expression of the plural, unless it has a clearly different meaning in the context. When a portion includes a composing element, the case may denote further including other composing elements without excluding other composing elements unless otherwise described.

FIG. 1 is a diagram illustrating an optical spectrometer including the optical filter 20, according to an exemplary embodiment.

Referring to FIG. 1, the optical spectrometer may include a light source 10, an optical filter 20, and a photodetector 30. After a first optical signal L1 from the light source 10 enters the optical filter 20, the first optical signal L1 may be divided into different optical signals from each other with respect to wavelengths, and the divided first optical signal, or a second optical signal L2, may be transmitted from the optical filter 20 to the photodetector 30. The photodetector 30 may sense the second optical signal L2 having passed through the optical filter 20, and may include a charge-coupled device (CCD), a photodiode, or a phototransistor. The first incident light L1 entering the optical filter 20 from the light source 10 may be incident on the optical filter 20, directly or via another sample or object.

Figure 2:
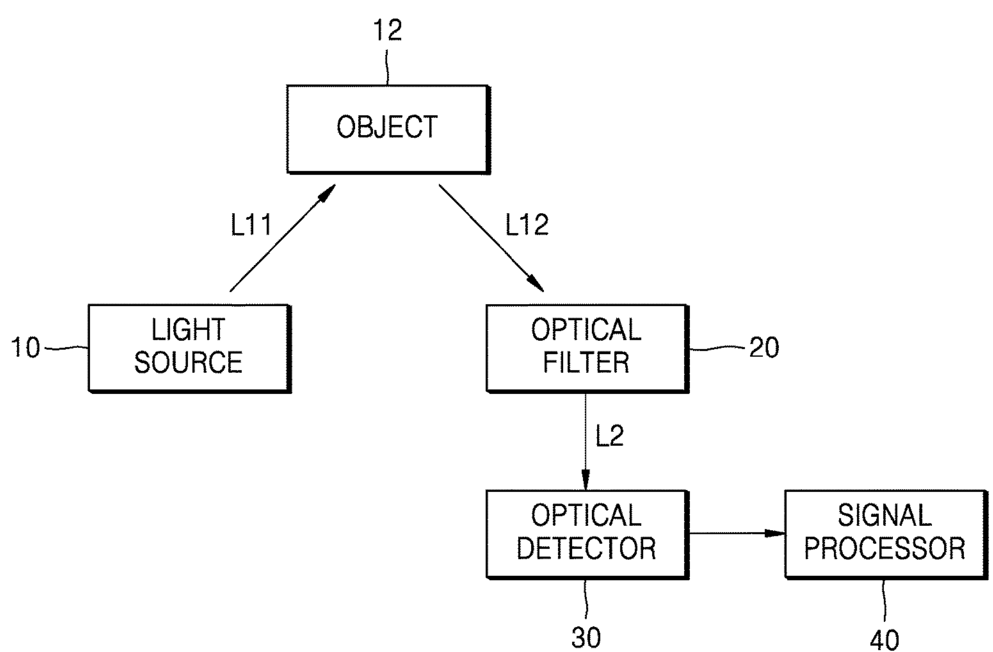
FIG. 2 is a diagram illustrating an optical spectrometer including an optical filter, according to an exemplary embodiment.

FIG. 2 is a diagram illustrating an optical spectrometer including the optical filter 20, according to an exemplary embodiment. In an exemplary embodiment, the first incident light L1 enters the optical filter 20 from the light source 10 via another sample, a subject, or the object 12.

Referring to FIG. 2, when an optical signal L11 irradiated from the light source 10 is incident on the object 12, the incident optical signal L11 may be reflected from an outer surface of the object 12, or penetrate the object 12 and then be reflected from an inner surface of the object 12. Thereafter, the optical signal L11 reflected from the object 12 may be incident on the optical filter 20. The optical signal L11 may include a plurality of light having different wavelengths from each other, and the light having different wavelengths from each other may be used to obtain various information about the object 12 such as physical properties, a shape, and a location.

The optical filter 20 may be a filter array formed by a plurality of filter elements in an array structure. The plurality of filter elements may be filter layers which are individually formed. The optical signal L12 incident on the optical filter 20 may be separated into second optical signals L2 with respect to the different wavelengths. When the second optical signals L2 which are different from each other with respect to the wavelengths are transferred to the photodetector (or optical detector) 30, original optical signals may be restored from the second optical signals L2. The second optical signals L2 incident on the photodetector 30 may be changed from optical signals to electrical signals and the electrical signals may be detected in the photodetector 30.

The detected electrical signals may be analyzed to obtain information about the object 12 via an arithmetic calculation in a signal processor 40. The information about the object 12 may include various information, and may include, for example but not limited to, information about an internal state, surface physical properties, a surface shape, the location, and a movement of the object 12. The information about the object 12 analyzed in the signal processor 40 may be transmitted to other devices or be visualized on display devices or be stored in separate information storage devices.

An optical accessory (not shown) which may change a path of the optical signal may be selectively arranged between the light source 10 and the object 12. In addition, an optical path changer (not shown) may be further arranged between the object 12 and the optical filter 20.

Figure 3:
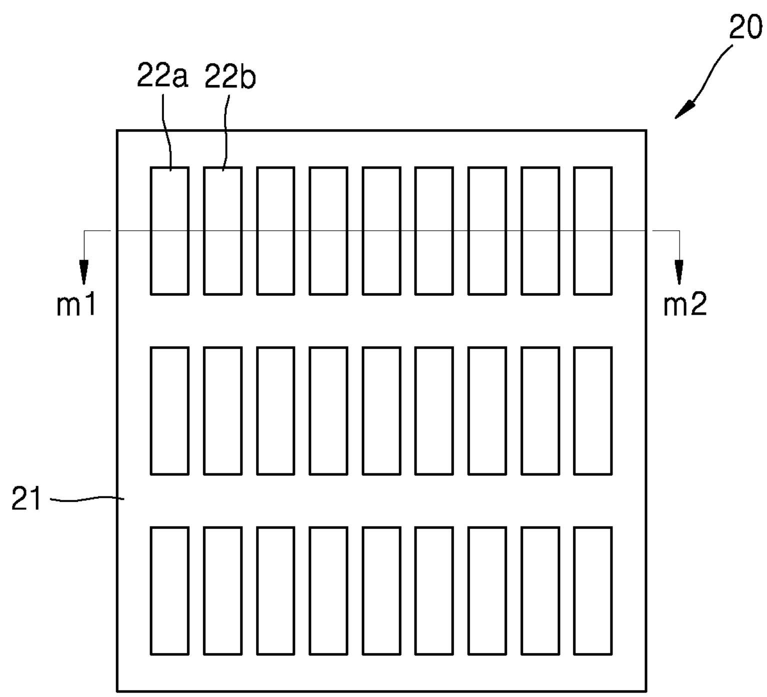
FIG. 3 is a plan view of a light incident surface of an optical filter, according to an exemplary embodiment.
Figure 4:
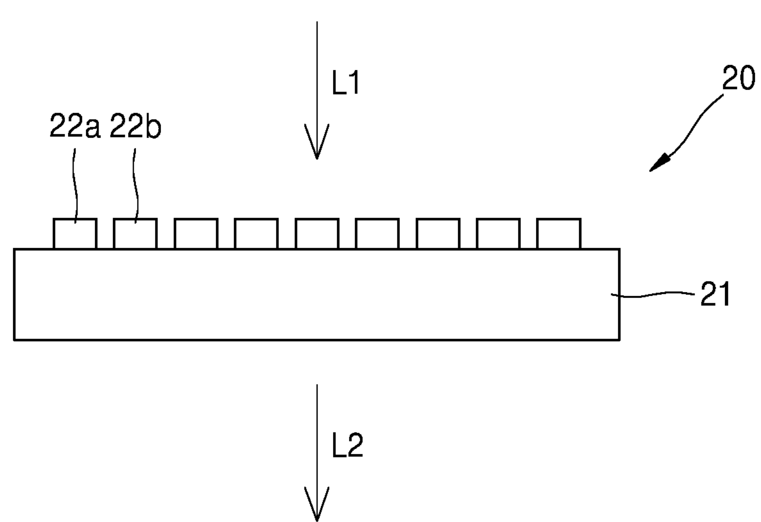
FIG. 4 is a cross-sectional view of the optical filter in FIG. 3, cut along a line m1-m2, according to an exemplary embodiment.

FIG. 3 is a plan view of a light incident surface of the optical filter 20, according to an exemplary embodiment. FIG. 4 is a cross-sectional view of the optical filter 20 cut along a line m1-m2 in FIG. 3, according to an exemplary embodiment.

Referring to FIGS. 3 and 4, the optical filter 20 may include at least one first filter layer 22*a* and at least one second filter layer 22*b* formed on a base substrate 21. The first and second filter layers 22*a* and 22*b* may include a plurality of perovskite material layers on the base substrate 21.

According to an exemplary embodiment, the optical filter 20 may easily control a band-gap by using a perovskite material which is applied to an absorption filter of the optical spectrometer. At least two of the first and second filter layers 22*a* and 22*b* of the optical filter 20 may have different composition ratios from each other and optical absorbance thereof may be different from each other. Accordingly, light absorbance or light transmittance of the first and second filter layers 22*a* and 22*b* may be respectively different from each other, and light absorbance spectra or light transmittance spectra of the first and second filter layers 22*a* and 22*b* may be respectively different. In other words, the first and second filter layers 22*a* and 22*b* may include different composition ratios of the perovskite material, and may represent band-gap characteristics in different light wavelength ranges from each other in a light absorbance spectrum or light transmittance spectrum.

The number of respective first and second filter layers 22*a* and 22*b* on the optical filter 20 may not be limited, and may be variously determined depending on usage conditions. According to an exemplary embodiment, an incident direction of the first optical signal L1 incident on the optical filter 20 may not necessarily be perpendicular to the surface of the optical filter 20 and dependence on the light incident angle of the optical filter 20 may not be high.

Shapes of the first and second filter layers 22*a* and 22*b* of the optical filter 20 illustrated in FIG. 3 may be variously formed and may be, for example, circular, elliptical, polygonal, or irregularly patterned. However, the exemplary embodiment is not limited thereto. In addition, sizes of the first and second filter layers 22*a* and 22*b* of the optical filter 20, for example, widths of the first and second filter layers 22*a* and 22*b* of the optical filter 20 on the incident surface, may be about 1 μm to several millimeters. The first and second filter layers 22*a* and 22*b* may be formed to have widths of about 1 μm or less. In this case, the first and second filter layers 22*a* and 22*b* may have widths greater than the wavelength of light incident on the optical filter 20. Spaces between respective first and second filter layers 22*a* and 22*b* of the optical filter 20 may not be limited, and may be about 1 μm to several millimeters.

According to an exemplary embodiment, the first and second filter layers 22*a* and 22*b* of the optical filter 20 may include the perovskite material. The perovskite material may be formed in a colloid perovskite solution process. The colloid perovskite material formed in the colloid perovskite solution process may include a core and ligand selectively surrounding the core. Core material, that is, the perovskite material, may be represented as a chemical formula of $ABX_3$, wherein A denotes ammonium salt or Cs, B denotes Sn or Pb, and X denotes a halogen element such as Cl, Br or I. The ligand selectively surrounding the core may include various chemical compounds having a hydrophobic alkyl group. The ligand may be a material such as carboxylic acid, phosphonic acid, and amine. In addition, the first and second filter layers 22*a* and 22*b* of the optical filter 20 may be selectively formed of the perovskite material obtained (or manufactured) via a bulk process, not the solution process.

The base substrate 21 of the optical filter 20 may formed of a material having a transparent property and may include glass, sapphire, quartz, transparent polymer, etc. However, the exemplary embodiment is not limited thereto.

According to an exemplary embodiment, the optical filter 20 may be formed independently of the photodetector 30 illustrated in FIGS. 1 and 2. The optical filter 20 may be selectively formed of a plurality of perovskite material layers on a top surface of the photodetector 30 so as to form the optical filter 20 and the photodetector 30 as an integral body. When the optical filter 20 and the photodetector 30 are formed as the integral body, the base substrate 21 of the optical filter 20 may be a transparent layer formed on the photodetector 30 or may be joined to the photodetector 30.

Figure 5A:
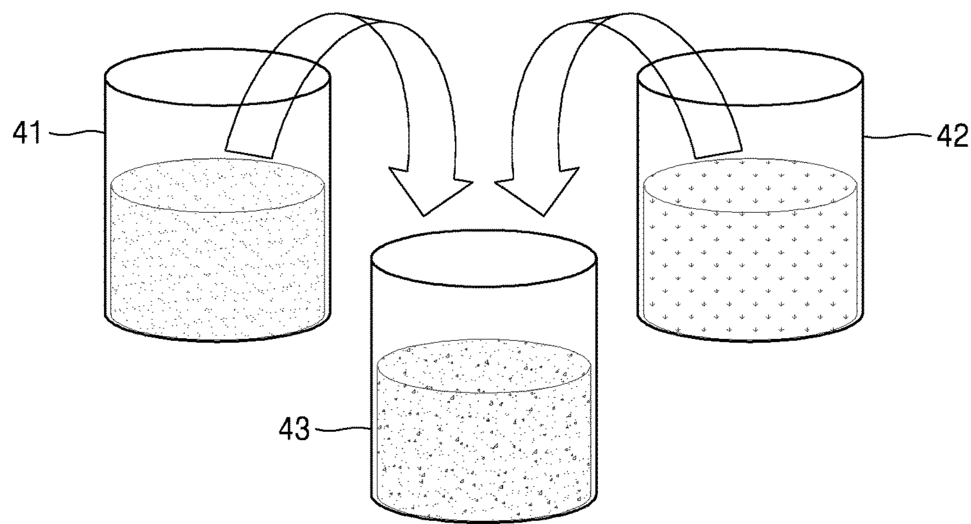
FIG. 5A is a diagram illustrating a process of obtaining a perovskite material according to an exemplary embodiment.
Figure 5B:
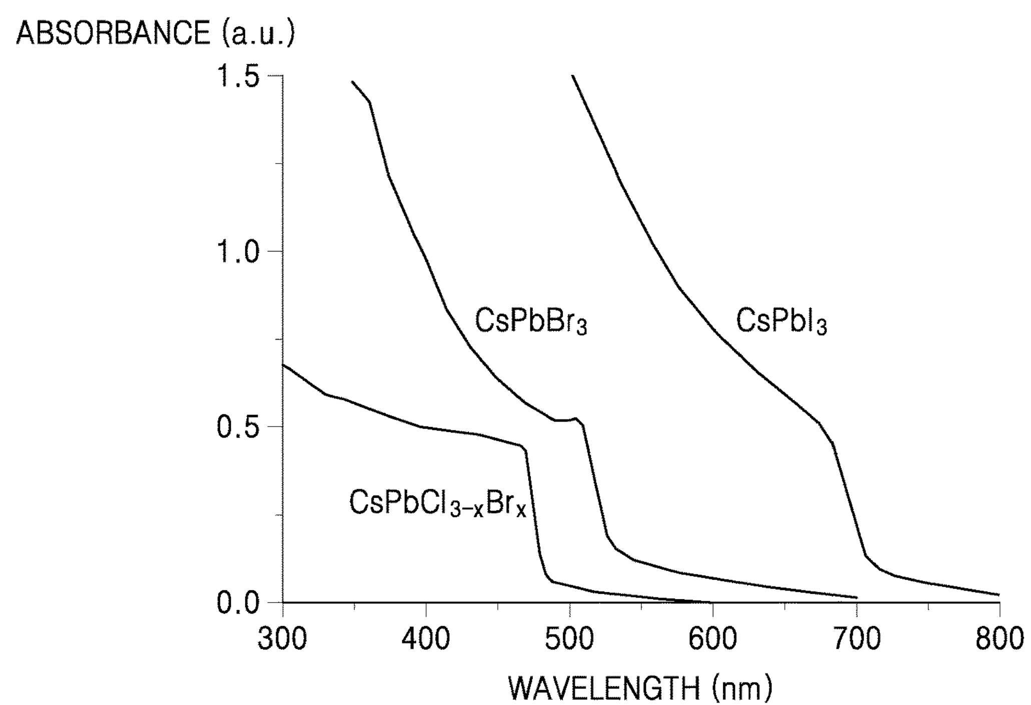
FIG. 5B is a graph illustrating light absorbance with respect to a wavelength of a perovskite material.

FIG. 5A is a diagram illustrating a process of obtaining a perovskite material used in an optical filter, according to an exemplary embodiment. FIG. 5B is a graph illustrating light absorbance with respect to a wavelength of the perovskite material.

Referring to FIG. 5A, a first solution 41 and a second solution 42 including perovskite samples having a chemical formula as $ABX_3$ may be mixed via a solution process to obtain a third solution 43 including a perovskite material used in the optical filter 20, according to an exemplary embodiment.

For example, the first solution 41 may include $CsPbBr_3$ and the second solution 42 may include $CsPbI_3$. The third solution 43 may be provided by mixing the first and second solutions 41 and 42 with various composition ratios and may have a chemical formula as $CsPbBr_{3-x}I_x$. In this case, the value of x may have a range of equal to or greater than 0 to equal to or less than 3 ($0 \le x \le 3$), and various perovskite materials may be combined by varying the composition ratios. Organic enzymes such as chloroform and toluene may be used as enzymes in the first and second solutions 41 and 42.

When a material corresponding to "X" in the chemical formula $ABX_3$ of the perovskite material includes at least two of Cl, Br, and I, filtering wavelength ranges of optical signals of the incident light may be changed by controlling respective composition ratios of at least two of Cl, Br, and I. For example, the perovskite material may be $CsPbBr_{3-x}Cl_x$ ($0 \le x \le 3$) or $CsPbBr_{3-x}I_x$ ($0 \le x \le 3$). As illustrated in FIG. 5B, $CsPbBr_3$ and $CsPbI_3$ show steep changes in the optical absorbance around optical wavelength ranges of about 510 nm and 700 nm, respectively. In addition, $CsPbCl_3$ may show a steep change in the optical absorbance around the optical wavelength range of about 400 nm. When the perovskite material is formed by controlling the composition ratios of Cl and Br (e.g., the perovskite material include $CsPbCl_{3-x}Br_x$), the optical absorbance may show a steep change in an optical wavelength range of about 400 nm and about 510 nm. In this manner, the filtering wavelength ranges may be controlled by controlling the composition ratios of at least two materials of, for example, $CsPbCl_3$, $CsPbBr_3$, and $CsPbI_3$.

The solution process may be executed at a room temperature. As a result, the colloid perovskite material having various band-gaps may be formed by mixing the first and second solutions 41 and 42 at the room temperature in various combinations and undergoing an anion exchange.

The optical filter 20 may be formed by doping the third solution 43 formed as illustrated in FIG. 5A on the base substrate 21 of FIG. 3 via methods such as a spin coating and a screen printing, and executing a patterning process. Thus, the first and second filter layers 22*a* and 22*b* used in the optical filter 20 may be formed of the perovskite material having various band-gaps, according to an exemplary embodiment illustrated in FIG. 3.

The first and second filter layers 22*a* and 22*b* may be formed of materials having different band-gaps from each other, and the plurality of filter layers formed on the base substrate 21 may be formed of the perovskite materials having different band-gaps from each other. The plurality of the first and second filter layers 22*a* and 22*b* of the optical filter 20 may be formed of the perovskite materials having completely different band-gaps from each other. In this manner, the perovskite materials having various band-gaps may be obtained from a small number of samples and thus, the optical filter 20 and a small optical spectrometer may be easily provided according to an exemplary embodiment.

In FIG. 5A, a mixing process of the first and second solutions 41 and 42 for forming the perovskite material is illustrated. However, a method of obtaining the perovskite material for the optical filter 20 according to exemplary embodiments is not limited thereto. The perovskite material may be selectively provided via the bulk process of combining solid-state samples for forming the filter layers of the optical filter, according to an exemplary embodiment. For example, the bulk process may be executed after controlling mixing ratios of at least two materials of solid-state samples of $CsPbCl_3$, $CsPbBr_3$, and $CsPbI_3$, and mixing the at least two materials. The filtering wavelength ranges may be controlled by forming the filter layers of the optical filter with the perovskite material provided via the bulk process.

Figure 6:
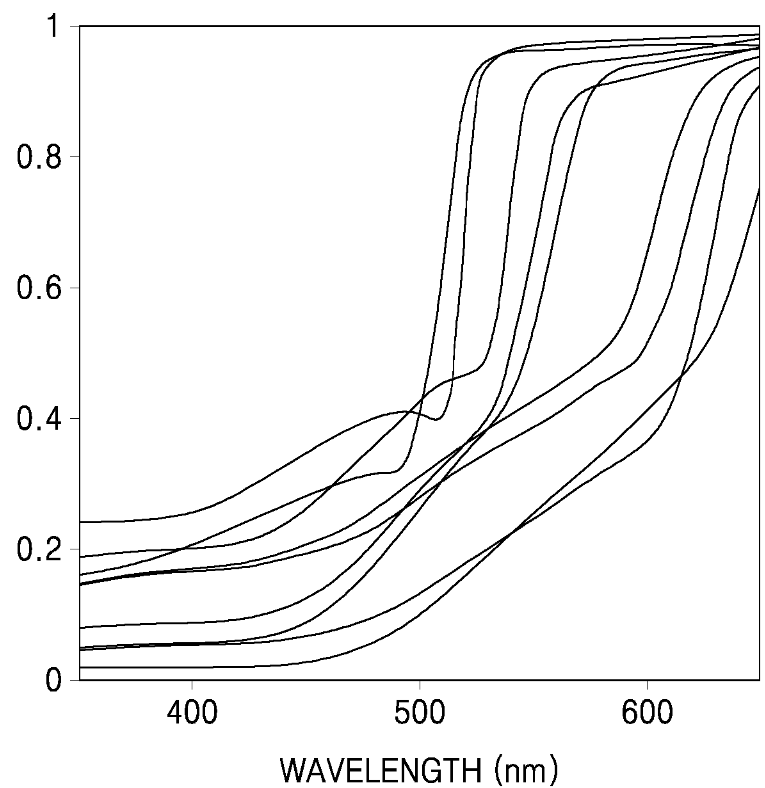
FIG. 6 is a graph illustrating transmission spectra of perovskite materials having various band-gaps.

FIG. 6 is a graph illustrating transmission spectra of the perovskite materials having various band-gaps.

Referring to FIG. 6, optical transmission is illustrated for incident light on various perovskite materials formed by changing the x in $CsPbBr_{3-x}I_x$ ($0 \le x \le 3$). It will be understood that ranges are vividly revealed where the optical transmission of the incident light steeply changes in the wavelength range of about 500 nm or more depending on respective perovskite materials.

Figure 7:
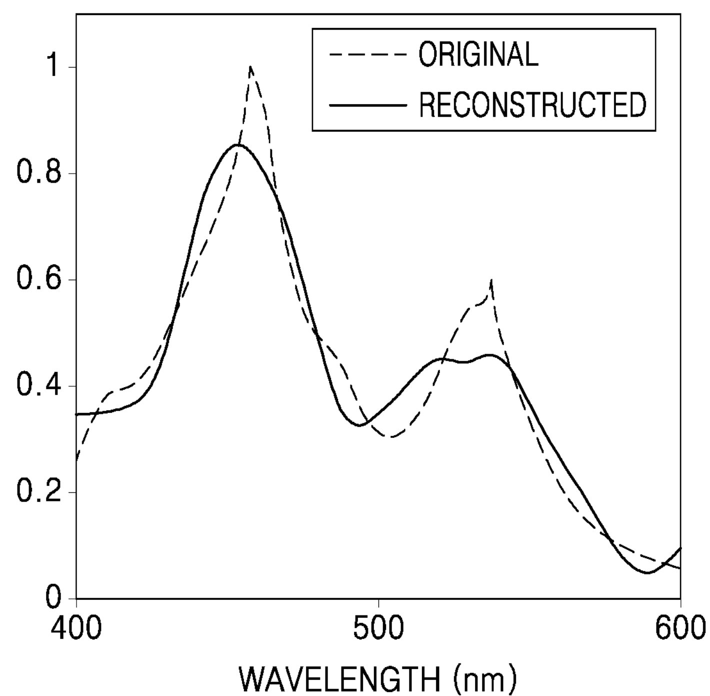
FIG. 7 is a graph illustrating a transmission spectrum corresponding to an optical filter including a perovskite material according to an exemplary embodiment.

FIG. 7 is a graph illustrating a transmission spectrum corresponding to an optical filter including the perovskite material according to an exemplary embodiment.

Referring to FIG. 7, the first optical signal L1 was irradiated to the optical filter 20 formed with the first and second filter layers 22*a* and 22*b* as illustrated in FIGS. 3 and 4 by using the perovskite material, $CsPbBr_{3-x}I_x$ ($0 \le x \le 3$). An original spectrum of the first optical signal L1 is illustrated as a dotted line. In addition, an optical spectrum reconstructed from the second optical signal L2, which is a result of the first optical signal L1 absorbed by, transmitted through, and emitted from the filter array of the optical filter 20, is illustrated as a solid line. It will be understood that locations and magnitudes of peaks of the original spectrum and those of the spectrum reconstructed by the optical filter 20 are similar to each other.

Figure 8:
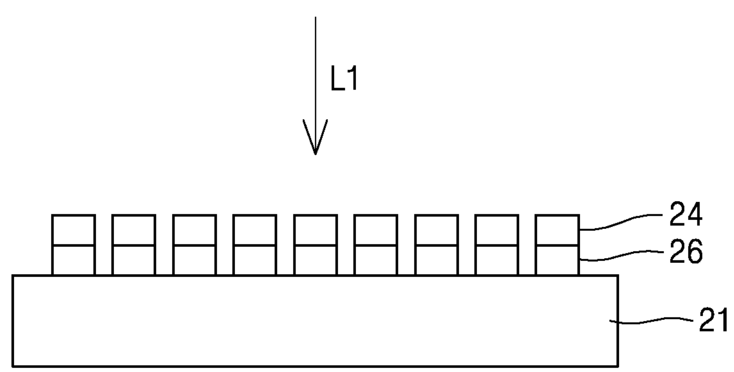
FIG. 8 is a cross-sectional view of an optical filter and a photodetector, according to another exemplary embodiment.

FIG. 8 is a cross-sectional view of an optical filter and a photodetector according to another exemplary embodiment.

Referring to FIG. 8, the optical filter and the photodetector may be integrally formed in an optical spectrometer according to another exemplary embodiment of the disclosure. The integrated optical filter and photodetector may include a p-n junction-type structure of a p-type layer 24 and an n-type layer 26 placed on the base structure 21 such as a substrate. In this case, the p-type layer 24 may include the perovskite material and the n-type layer 26 may include metal oxides having n-type characteristics such as Zn oxides and Ti oxides.

The p-type layer 24 may include the perovskite material and the perovskite material may be represented as a chemical formula of $ABX_3$, wherein A represents the ammonium salt, or Cs, etc., B represents Sn, or Pb, etc., and X represents the halogen material such as Cl, Br, and I.

When the optical filter and the photodetector are integrally formed in this manner, the optical signal L12 incident on the p-type layer 24 may be filtered by the p-type layer 24, and the p-type layer 24 and the n-type layer 26 may be respectively connected to the signal processor 40 in FIG. 2 and individually used in connection with the signal processor 40.

According to exemplary embodiments, an optical filter including a perovskite material layer and an optical spectrometer including the optical filter are provided. The perovskite material layer used for the optical filter may be formed in a simple method via a combination of several materials. Optical filters having low dependence on an optical incident angle and small-sized optical spectrometers including the optical filters may be provided by the optical filter including the perovskite material layer.

It should be understood that the exemplary embodiments described herein should be considered in a descriptive sense only and not for purposes of limitation. Descriptions of features or aspects within each embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An optical filter comprising:

a base substrate comprising a transparent material; and a filter layer on the base substrate, wherein the filter layer comprises a perovskite material, wherein the filter layer comprises a plurality of filter layers, and at least two of the plurality of filter layers are formed of perovskite materials having different composition ratios from each other, and the at least two of the plurality of filter layers are spaced apart from each other in a direction perpendicular to a direction of thickness of the base substrate, and wherein the perovskite materials comprise CsPbBr3-xClx ($0 \leq x \leq 3$) or CsPbBr3-xIx ($0 \leq x \leq 3$), and the at least two of the plurality of filter layers comprise the perovskite materials having different values of x from each other.

2. The optical filter of claim 1, wherein the at least two of the plurality of filter layers have different optical absorption rates or different optical transmittances from each other.

3. The optical filter of claim 1, wherein the at least two of the plurality of filter layers have band-gap characteristics in different optical wavelength ranges from each other in at least one of an optical absorption spectrum and an optical transmission spectrum.

4. The optical filter of claim 1, wherein the perovskite materials further comprise a material represented as a chemical formula of ABX3, wherein A denotes ammonium salt or cesium (Cs), B denotes tin (Sn) or lead (Pb), and X denotes a halogen element.

5. The optical filter of claim 4, wherein the halogen element comprises chloride (Cl), bromide (Br), or indium (I).

6. The optical filter of claim 1, wherein widths of the at least two of the plurality of filter layers are in a range of about 1 μm to several millimeters.

7. An optical spectrometer comprising:

a light source;

an optical filter on which a first optical signal irradiated from the light source is incident, directly or via an object; and a photodetector on which a second optical signal passing through the optical filter is incident, wherein the optical filter comprises a base substrate and a filter layer on the base substrate, the filter layer comprising a perovskite material, wherein the filter layer comprises a plurality of filter layers, and at least two of the plurality of filter layers are formed of perovskite materials having different composition ratios from each other, and the at least two of the plurality of filter layers are spaced apart from each other in a direction perpendicular to a direction of thickness of the base substrate, and wherein the perovskite materials comprise CsPbBr3-xClx ($0 \leq x \leq 3$) or CsPbBr3-xIx ($0 \leq x \leq 3$), and the at least two of the plurality of filter layers comprise the perovskite materials having different values of x from each other.

8. The optical spectrometer of claim 7, wherein the at least two of the plurality of filter layers have band-gap characteristics in different optical wavelength ranges from each other in an optical absorption spectrum or an optical transmission spectrum.

9. The optical spectrometer of claim 7, wherein the perovskite materials further comprise a material represented as a chemical formula of ABX3, wherein A denotes ammonium salt or Cs, B denotes Sn or Pb, and X denotes Cl, Br, or I.

10. The optical spectrometer of claim 7, wherein the base substrate is on the photodetector to form the optical filter and the photodetector in an integrated body.

11. An optical spectrometer comprising:

a light source; and an integrated body of an optical filter and a photodetector on which a first optical signal irradiated from the light source is incident, either directly or via an object, wherein the integrated body of the optical filter and the photodetector comprises a p-n junction structure, the p-n junction structure comprising an n-type layer formed on a bottom structure and a p-type layer formed on the n-type layer, wherein the p-n junction structure comprises a plurality of p-n junction structures, and at least two of the plurality of p-n junction structures are spaced apart from each other in a direction perpendicular to a direction of thickness of a base substrate of the optical filter, wherein at least two of p-type layers of the plurality of p-n junction structures include perovskite materials, and wherein the perovskite materials comprise CsPbBr3-xClx ($0 \leq x \leq 3$) or CsPbBr3-xIx ($0 \leq x \leq 3$), and the at least two of p-type layers of the plurality of p-n junction structures comprise the perovskite materials having different values of x from each other.

12. The optical spectrometer of claim 11, wherein the n-type layer comprises metal oxides having n-type characteristics, such as zinc (Zn) oxides or titanium (Ti) oxides.

* * * * *